(12) United States Patent
Zhao et al.

(10) Patent No.: US 9,275,976 B2
(45) Date of Patent: Mar. 1, 2016

(54) SYSTEM-IN-PACKAGE WITH INTEGRATED SOCKET

(75) Inventors: Sam Ziqun Zhao, Irvine, CA (US);
Kevin Kunzhong Hu, Irvine, CA (US);
Sampath K. V. Karikalan, Irvine, CA (US); Rezaur Rahman Khan, Rancho Santa Margarita, CA (US); Pieter Vorenkamp, Laguna Niguel, CA (US);
Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/405,207

(22) Filed: Feb. 24, 2012

(65) Prior Publication Data
US 2013/0221500 A1 Aug. 29, 2013

(51) Int. Cl.
*H01L 23/552* (2006.01)
*H01L 25/065* (2006.01)

(52) U.S. Cl.
CPC .......... *H01L 25/0657* (2013.01); *H01L 23/552* (2013.01); *H01L 2224/1403* (2013.01); *H01L 2224/14181* (2013.01); *H01L 2224/16225* (2013.01); *H01L 2224/32225* (2013.01); *H01L 2224/32245* (2013.01); *H01L 2224/73253* (2013.01); *H01L 2225/06517* (2013.01); *H01L 2225/06537* (2013.01); *H01L 2225/06572* (2013.01); *H01L 2225/06589* (2013.01)

(58) Field of Classification Search
CPC ..... H01L 25/065; H01L 23/34; H01L 23/367;
H01L 23/42; H01L 23/5384; H01L 24/73;
H01L 27/108; H01L 23/3672; H01L 23/481;
H01L 25/50; H01L 25/0657; H01L 23/552;
H01L 2224/73253; H01L 2224/32225; H01L
2224/16225; H01L 2224/32245; H01L
2224/14181; H01L 2224/1403; H01L
2225/06537; H01L 2225/06589; H01L
2225/06572; H01L 2225/06517
USPC .................... 257/48, 737, E21.502, E23.001, 257/E21.158, E23.068; 438/124, 666
See application file for complete search history.

(56) References Cited

U.S. PATENT DOCUMENTS

| | | | |
|---|---|---|---|
| 5,198,963 A | 3/1993 | Gupta | |
| 6,002,168 A | 12/1999 | Bellaar | |
| 6,188,578 B1 | 2/2001 | Lin | |

(Continued)

FOREIGN PATENT DOCUMENTS

| | | |
|---|---|---|
| CN | 101390207 A | 3/2009 |
| CN | 203205406 U | 9/2013 |

(Continued)

*Primary Examiner* — Bilkis Jahan
(74) *Attorney, Agent, or Firm* — McDermott Will & Emery LLP

(57) ABSTRACT

There are disclosed herein various implementations of a system-in-package with integrated socket. In one such implementation, the system-in-package includes a first active die having a first plurality of electrical connectors on a top surface of the first active die, an interposer situated over the first active die, and a second active die having a second plurality of electrical connectors on a bottom surface of the second active die. The interposer is configured to selectively couple at least one of the first plurality of electrical connectors to at least one of the second plurality of electrical connectors. In addition, a socket encloses the first and second active dies and the interposer, the socket being electrically coupled to at least one of the first active die, the second active die, and the interposer.

20 Claims, 3 Drawing Sheets

(56) References Cited

U.S. PATENT DOCUMENTS

| | | | |
|---|---|---|---|
| 6,459,039 B1* | 10/2002 | Bezama et al. | 174/359 |
| 6,461,895 B1 | 10/2002 | Liang | |
| 6,709,898 B1 | 3/2004 | Ma | |
| 6,743,661 B1 | 6/2004 | Drewery | |
| 6,791,195 B2 | 9/2004 | Urushima | |
| 7,220,667 B2 | 5/2007 | Yamagata | |
| 7,585,702 B1 | 9/2009 | Wang | |
| 7,675,163 B2 | 3/2010 | Heydari | |
| 7,834,450 B2 | 11/2010 | Kang | |
| 7,838,337 B2 | 11/2010 | Marimuthu | |
| 7,901,986 B2 | 3/2011 | Arai | |
| 8,008,125 B2 | 8/2011 | McConnelee | |
| 8,022,555 B2 | 9/2011 | Hwang | |
| 8,133,761 B2 | 3/2012 | Gerber | |
| 8,202,763 B2 | 6/2012 | Meyer | |
| 8,222,718 B2 | 7/2012 | Jereza | |
| 8,310,063 B2 | 11/2012 | Wang | |
| 8,344,516 B2 | 1/2013 | Chainer | |
| 8,461,672 B2 | 6/2013 | Haba | |
| 8,749,072 B2* | 6/2014 | Zhao | H01L 25/105 257/686 |
| 2002/0030261 A1 | 3/2002 | Rolda | |
| 2003/0036219 A1 | 2/2003 | Masumoto | |
| 2003/0189814 A1* | 10/2003 | Kato et al. | 361/715 |
| 2005/0218518 A1 | 10/2005 | Jiang | |
| 2006/0145328 A1 | 7/2006 | Hsu | |
| 2006/0186531 A1 | 8/2006 | Hsu | |
| 2006/0186536 A1 | 8/2006 | Hsu | |
| 2006/0220262 A1 | 10/2006 | Meyer | |
| 2006/0258044 A1 | 11/2006 | Meyer | |
| 2007/0065984 A1* | 3/2007 | Lau et al. | 438/107 |
| 2007/0132082 A1 | 6/2007 | Tang | |
| 2007/0209831 A1 | 9/2007 | Sakamoto | |
| 2007/0273049 A1 | 11/2007 | Khan | |
| 2007/0290376 A1 | 12/2007 | Zhao | |
| 2008/0044944 A1 | 2/2008 | Wakisaka | |
| 2008/0111225 A1* | 5/2008 | Kim | H01L 25/0657 257/686 |
| 2008/0128882 A1 | 6/2008 | Baek | |
| 2008/0157322 A1 | 7/2008 | Tang | |
| 2008/0157328 A1 | 7/2008 | Kawata | |
| 2008/0246138 A1 | 10/2008 | Gerber | |
| 2008/0268638 A1 | 10/2008 | Dertinger | |
| 2008/0296697 A1* | 12/2008 | Hsu et al. | 257/379 |
| 2009/0053858 A1 | 2/2009 | Ko | |
| 2009/0102030 A1 | 4/2009 | Khan | |
| 2009/0152708 A1 | 6/2009 | Lee | |
| 2010/0019360 A1 | 1/2010 | Khan | |
| 2010/0084754 A1 | 4/2010 | Yoo | |
| 2010/0133534 A1* | 6/2010 | Do et al. | 257/48 |
| 2010/0301474 A1 | 12/2010 | Yang | |
| 2011/0024888 A1 | 2/2011 | Pagaila | |
| 2011/0024906 A1 | 2/2011 | Meyer | |
| 2011/0241185 A1 | 10/2011 | Koester | |
| 2011/0254160 A1 | 10/2011 | Tsai | |
| 2011/0272819 A1 | 11/2011 | Park | |
| 2011/0278732 A1 | 11/2011 | Yu | |
| 2011/0285030 A1 | 11/2011 | Meyer | |
| 2011/0304015 A1 | 12/2011 | Kim et al. | |
| 2012/0001314 A1* | 1/2012 | Schuetz | H01L 23/367 257/690 |
| 2012/0007229 A1 | 1/2012 | Bartley et al. | |
| 2012/0009738 A1 | 1/2012 | Crawford | |
| 2012/0018899 A1 | 1/2012 | Pagaila | |
| 2012/0043668 A1* | 2/2012 | Refai-Ahmed et al. | 257/777 |
| 2012/0043669 A1* | 2/2012 | Refai-Ahmed et al. | 257/777 |
| 2012/0062439 A1 | 3/2012 | Liao | |
| 2012/0139105 A1* | 6/2012 | Lin et al. | 257/737 |
| 2012/0152605 A1 | 6/2012 | Das | |
| 2012/0168942 A1 | 7/2012 | Gan | |
| 2012/0211885 A1 | 8/2012 | Choi | |
| 2012/0223429 A1 | 9/2012 | Khan | |
| 2012/0225522 A1 | 9/2012 | Zhao | |
| 2012/0228753 A1 | 9/2012 | Ko | |
| 2012/0241921 A1 | 9/2012 | Lee | |
| 2012/0313240 A1 | 12/2012 | Cheng | |
| 2012/0319293 A1 | 12/2012 | Cheah | |
| 2013/0000968 A1 | 1/2013 | Zhao | |
| 2013/0062764 A1 | 3/2013 | Jin | |
| 2013/0075917 A1 | 3/2013 | Law | |
| 2013/0113098 A1 | 5/2013 | Hwang | |
| 2013/0147023 A1 | 6/2013 | Lin | |

FOREIGN PATENT DOCUMENTS

| | | |
|---|---|---|
| EP | 1988570 A1 | 11/2008 |
| FR | 2901636 | 11/2007 |
| KR | 10-2011-0036249 | 4/2011 |

* cited by examiner

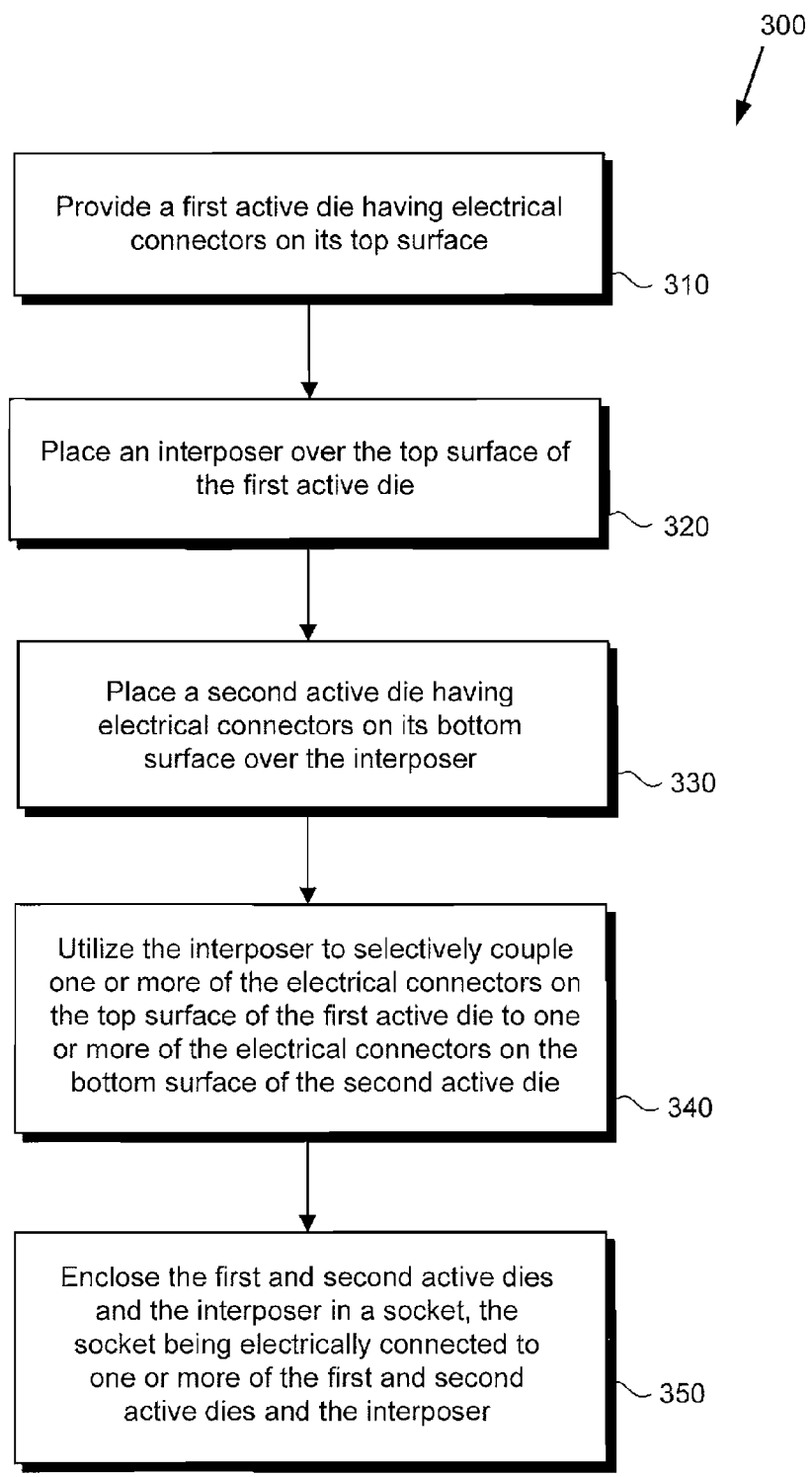

SYSTEM-IN-PACKAGE WITH INTEGRATED SOCKET

BACKGROUND

Packaging solutions continue to evolve to meet the increasingly stringent design constraints imposed by electronic systems with ever higher integrated circuit (IC) densities. One solution for providing power and ground connections, as well as input/output (I/O) signals, for example, to multiple active dies within a single semiconductor package utilizes one or more interposers to electrically couple the active dies to the package substrate.

However, as the trend toward ever more massively integrated systems continues through the co-packaging of more and more active dies, the vulnerability of those systems to performance degradation due to inadequate thermal dissipation and/or electromagnetic shielding and/or poor signal integrity, for example, may become more acute. In view of these and other challenges to ensuring reliable performance by more modern system-in-package implementations, the use of interposers alone may not provide an optimum solution for accommodating power and heat distribution among the active dies forming a massively integrated system.

SUMMARY

The present disclosure is directed to a system-in-package with integrated socket, substantially as shown in and/or described in connection with at least one of the figures, and as set forth more completely in the claims.

BRIEF DESCRIPTION OF THE DRAWINGS

FIG. 3 shows a flowchart presenting an exemplary method for producing a system-in-package with integrated socket.

DETAILED DESCRIPTION

Figure 1:
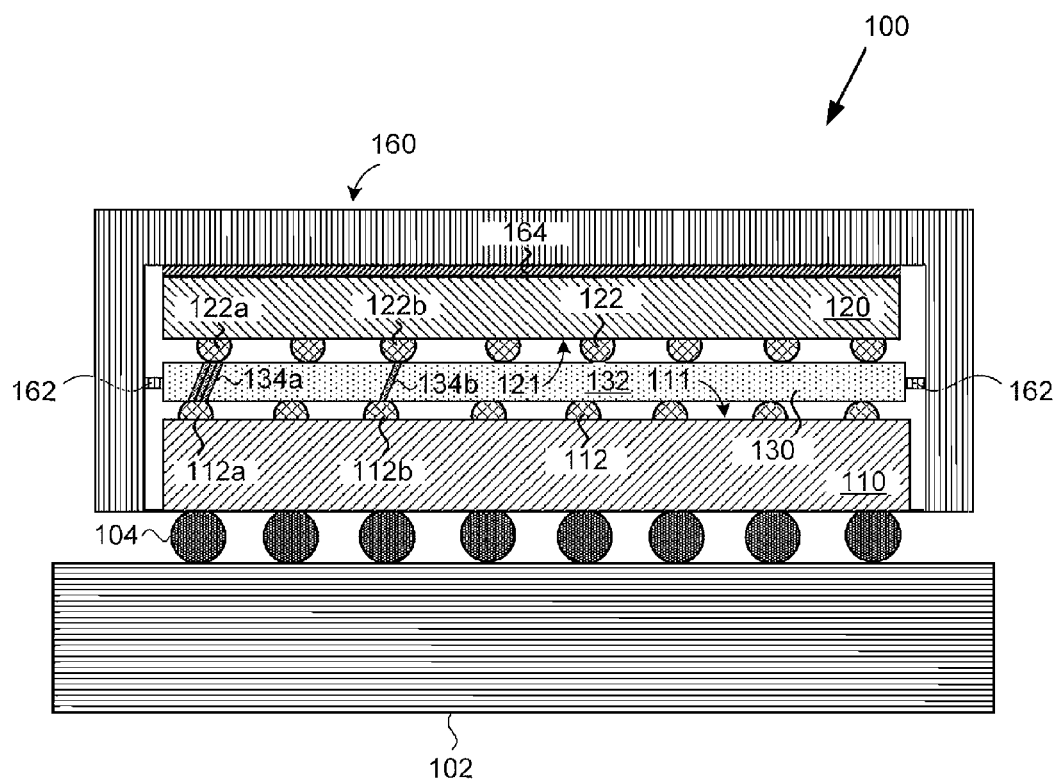
FIG. 1 shows a cross-sectional view of one implementation of a system-in-package with integrated socket.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of one implementation of a system-in-package with integrated socket. As shown in FIG. 1, system-in-package 100 includes first active die 110, second active die 120, and interposer 130 including interposer dielectric 132 and through-interposer connections 134a and 134b, all enclosed by socket 160 including socket contacts 162. In addition, system-in-package 100 includes adhesion layer 164 for attaching second active die 120 to an inner surface of socket 160, micro-bumps 112 including micro-bumps 112a and 112b coupling top surface 111 of first active die 110 to interposer 130, and micro-bumps 122 including micro-bumps 122a and 122b coupling bottom surface 121 of second active die 120 to interposer 130. Also shown in FIG. 1 are solder balls 104 electrically connecting system-in-package 100 to substrate 102, which may be a package substrate or printed circuit board (PCB), for example.

It is noted that although only one of solder balls 104 is specifically designated by that reference number in FIG. 1, any or all of the solder balls shown to connect system-in-package 100 to substrate 102 may be characterized or referred to as solder ball(s) 104. Moreover, although only one each of micro-bumps 112 and micro-bumps 122 is expressly labeled as such, any or all of the micro-bumps shown at top surface 111 of first active die 110, including micro-bumps 112a and 112b, may be characterized or referred to as micro-bump(s) 112, while any or all of the micro-bumps shown at bottom surface 121 of second active die 120, including micro-bumps 122a and 122b, may be characterized or referred to as micro-bump(s) 122.

As shown by FIG. 1, first active die 110 has electrical connectors in the form of micro-bumps 112 on top surface 111 of first active die 110. As further shown by FIG. 1, interposer 130 is situated over first active die 110 and micro-bumps 112. In addition, according to the implementation shown in FIG. 1, second active die 120 including electrical connectors in the form of micro-bumps 122 on bottom surface 121 of second active die 120 is shown to overlie interposer 130. It is noted that, as depicted in FIG. 1, interposer 130 is configured to selectively couple at least one of micro-bumps 112 to at least one of microbumps 122. In other words, according to the present implementation, interposer 130 is configured to provide through-interposer connection 134a for selectively coupling micro-bump 112a on top surface 111 of first active die 110 to micro-bump 122a on bottom surface 121 of second active die 120, as well as to selectively couple micro-bump 112b to micro-bump 122b by selectively providing through-interposer connection 134b. As depicted in FIG. 1, according to one implementation, socket 160 encloses first active die 110, second active die 120, and interposer 130, and is electrically connected to interposer 130 by socket contacts 162.

Socket 160 may be an electrically and thermally conductive socket, and may be formed of a metal or metal alloy, such as copper or a copper alloy, for example. Alternatively, socket 160 may be formed of a non-metal material such as a plastic or molding compound, but have electrical routing and/or one or more ground planes formed therein for providing electrical connections through socket contacts 162. In one implementation, socket 160 may be configured to shield first active die 110, second active die 120, and interposer 130 from electromagnetic interference, for example, and/or be configured to provide a common package ground for system-in-package 100 including first active die 110, second active die 120, and interposer 130. Moreover, in some implementations, socket 160 may be configured to provide a heat sink for first active die 110, second active die 120, and interposer 130 so as to enable enhanced thermal dissipation for system-in-package 100. In yet other implementations, socket 160 may be configured to provide enhanced environmental protection, such as moisture protection, for system-in-package 100.

First active die 110 and second active die 120 may be packaged or unpackaged dies, for example. As shown in FIG. 1, second active die 120 is attached to an inner surface of socket 160 by adhesion layer 164, which may also be implemented to serve as a thermal shunt for enabling effective use of socket 160 as a heat sink for second active die 120. Adhesion layer 164 may be a die-attach film (DAF), for example, or any suitable thermally conductive adhesive material. It is noted that although the implementation shown in FIG. 1 depicts system-in-package 100 to have two active dies enclosed by socket 160 and electrically coupled together by interposer 130, e.g., first active die 110 and second active die 120, in one implementation, several or even numerous active dies in addition to first active die 110 and second active die 120 may be electrically coupled together by one or more interposers, such as interposer 130, and be enclosed by socket 160 to form a system-in-package according to the present inventive principles.

As described above, interposer 130 includes interposer dielectric 132 and through-interposer connections 134a and 134b formed in interposer dielectric 132. Interposer dielectric 132 may be formed of a rigid dielectric material, such as fiber reinforced bismaleimide triazine (BT), FR-4, glass, or ceramic, for example. Alternatively, interposer dielectric 132 may be formed of an epoxy-phenolic or cyanate ester-epoxy build-up material. As a specific example, in one implementation, interposer dielectric 132 may be formed of an Ajinomoto™ Build-up Film (ABF). According to that exemplary implementation, through-interposer connections 134a and 134b can be formed during a build-up process for forming interposer dielectric 132, using any suitable technique known in the art.

In still other implementations, interposer 130 may include at least one selectively conductive film. For example, and as specifically represented in FIG. 1, interposer dielectric 132 may be a flexible dielectric formed of a polyimide film or other suitable polymer matrix having conductive bodies dispersed therein for selectively providing through-interposer connections, such as through-interposer connections 134a and 134b. As a specific example, in one implementation, interposer 130 may be formed of a B-stage polymeric film serving as interposer dielectric 132 and having conductive bodies such as conductive nano-wires or conductive nano-tubes dispersed therein. In some implementations, such conductive bodies may be substantially uniformly distributed in interposer dielectric 132, and have their primary axes (e.g., length axis of nano-wire or nanotube) oriented substantially parallel to the plane of interposer 130. In such implementations, an external field, such as an external electromagnetic field, for example, may be applied to interposer dielectric 132 to selectively reorient some of the conductive bodies dispersed therein so as to form through-interposer connections 134a and 134b. When formed of a selectively conductive film, interposer 130 may then undergo a cure process, such as an ultra-violet (UV) cure or other radiation cure, for example, to more permanently establish through-interposer connections 134a and 134b.

According to the implementation shown in FIG. 1, first active die 110 and second active die 120 are electrically connected to interposer 130 by micro-bumps 112 and 122, respectively. It is noted, however, that more generally, micro-bumps 112 and 122 may correspond to any electrical connectors suitable for coupling first active die 110 and second active die 120 to interposer 130. Thus, in other implementations, micro-bumps 112 and/or 122 may correspond to conductive posts or pillars such as, for example, metal posts or pillars formed of copper. Moreover, in other implementations, solder balls 104 may correspond to any conductive bodies suitable for forming stable electrical connections between system-in-package 100 and substrate 102.

Figure 2:
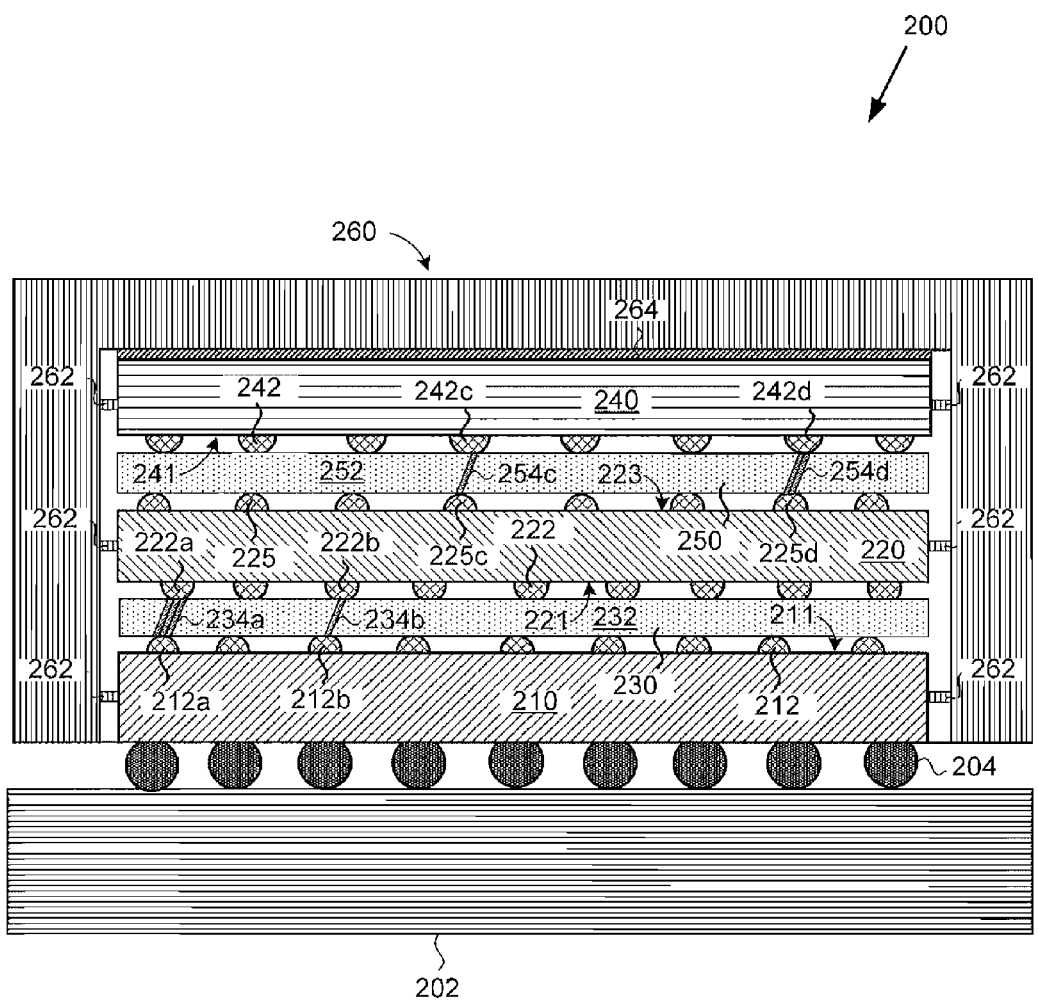
FIG. 2 shows a cross-sectional view of another implementation of a system-in-package with integrated socket.

Moving now to FIG. 2, FIG. 2 shows a cross-sectional view of another implementation of a system-in-package with integrated socket. As shown in FIG. 2, system-in-package 200 includes first active die 210, second active die 220, first interposer 230 including interposer dielectric 232 and through-interposer connections 234a and 234b, third active die 240, and second interposer 250 including interposer dielectric 252 and through-interposer connections 254c and 254d, all enclosed by socket 260 including socket contacts 262. It is noted that although the features corresponding to reference numbers 210, 220, and 240 are presently characterized as respective active dies, in other implementations, one or more of those features may be active packages. In other words, in various implementations, the features represented by reference numbers 210, 220, and 240 may correspond to active dies, active packages, or any combination of active dies and active packages.

As further shown in FIG. 2, system-in-package 200 includes adhesion layer 264 attaching third active die 240 to and inner surface of socket 260, micro-bumps 212 including micro-bumps 212a and 212b coupling top surface 211 of first active die 210 to first interposer 230, micro-bumps 222 including micro-bumps 222a and 222b coupling bottom surface 221 of second active die 220 to first interposer 230, micro-bumps 225 including micro-bumps 225c and 225d coupling top surface 223 of second active die 220 to second interposer 250, and micro-bumps 242 including micro-bumps 242c and 242d coupling bottom surface 241 of third active die 240 to second interposer 250. Also shown in FIG. 2 are solder balls 204 electrically connecting system-in-package 200 to substrate 202.

First active die 210, second active die 220, first interposer 230 including through-interposer connections 234a and 234b, adhesion layer 264, micro-bumps 212 and 222, solder balls 204, and substrate 202 correspond respectively to first active die 110, second active die 120, interposer 130 including through-interposer connections 134a and 134b, adhesion layer 164, micro-bumps 112 and 122, solder balls 104, and substrate 102, in FIG. 1, and may share the characteristics attributed to those corresponding features above. In addition, socket 260 including socket contacts 262 corresponds in general to socket 160, in FIG. 1. However, according to the implementation shown in FIG. 2, socket 260 is electrically coupled to each of first active die 210, second active die 220, and third active die 240 by socket contacts 262.

It is noted that although only one of micro-bumps 225 and one of micro-bumps 242 are specifically designated by those respective reference numbers in FIG. 2, any or all of the micro-bumps shown at top surface 223 of second active die 220, including micro-bumps 225c and 225d, and any or all of the micro-bumps shown at bottom surface 241 of third active die 240, including micro-bumps 242c and 242d, may be characterized or referred to as respective micro-bump(s) 225 and 242. It is further noted that although the implementation shown in FIG. 2 depicts system-in-package 200 to include three active dies and two interposers enclosed by socket 260, e.g., first active die 210, second active die 220, third active die 240, first interposer 230, and second interposer 250, in other implementations, system-in-package 200 may contain many active dies, such as fifty active dies, for example, or one hundred active dies, interconnected using any suitable number and type of interposers.

As shown by FIG. 2, second active die 220 has electrical connectors in the form of micro-bumps 225 on top surface 223 of second active die 220, while third active die 240 has electrical connectors in the form of micro-bumps 242 on bottom surface 241 of third active die 240. As further shown by FIG. 2, second interposer 250, which, like first interposer 230, may include at least one selectively conductive film, for example, is situated between second active die 220 and third active die 240.

FIG. 2 also shows that second interposer 250 is configured to selectively couple at least one of micro-bumps 225 to at least one of micro-bumps 242. In other words, second interposer 250 is configured to provide through-interposer connection 254c for selectively coupling micro-bump 225c on top surface 223 of second active die 220 to micro-bump 242c on bottom surface 241 of third active die 240, as well as to selectively couple micro-bump 225d to micro-bump 242d by providing through-interposer connection 254d.

Second interposer 250 includes interposer dielectric 252 and through-interposer connections 254c and 254d established in interposer dielectric 252. Like interposer dielectric 132, in FIG. 1, interposer dielectric 252 may be formed of a rigid dielectric material, such as BT, FR-4, glass, or ceramic, for example, or may be formed of ABF™. Moreover, in some implementations, interposer dielectric 252 may be formed over a semiconductor interposer substrate, such as a silicon substrate, (interposer substrate not shown in FIG. 2).

In one implementation, second interposer 250 may include at least one selectively conductive film. In those implementations, interposer dielectric 252 may be a flexible dielectric formed of a polymer matrix, such as a B-stage polymeric film, for example, having conductive bodies such as conductive nano-wires or conductive nanotubes dispersed therein for selectively providing through-interposer connections 254c and 254d, as described above by reference to use of a selectively conductive film in interposer 130, in FIG. 1. In some implementations, second interposer 250 may be formed from an anisotropic conductive film (ACF). In some implementations, for example, the dispersion of conductive bodies within the ACF may be programmed to selectively provide through-interposer connections at desired locations within interposer dielectric 252 corresponding to through-interposer connections 254c and 254d, in FIG. 2, while assuring dielectric integrity elsewhere.

Continuing to FIG. 3, FIG. 3 shows flowchart 300, which describes an exemplary method for producing a system-in-package with integrated socket. With respect to the method outlined in FIG. 3, it is noted that certain details and features have been left out of flowchart 300 in order not to obscure the discussion of the inventive features in the present application.

Referring to flowchart 300 with additional reference to system-in-package 100, FIG. 1, flowchart 300 begins when first active die 110 having electrical connectors in the form of micro-bumps 112 on top surface 111 is provided for packaging within system-in-package 100 (310). Flowchart 300 continues with placement of interposer 130 over top surface 111 of first active die 110 (320). As discussed above, interposer 130 includes interposer dielectric 132, which may be a flexible dielectric formed of a polyimide film or other suitable polymer matrix having conductive bodies dispersed therein for selectively providing through-interposer connections. In one implementation, interposer 130 may be formed from ACF, for example, wherein the dispersion of conductive bodies within the ACF is programmed to selectively provide through-interposer connections at desired locations within interposer 130, e.g. through-interposer connections 134a and 134b.

Flowchart 300 continues when second active die 120 including electrical connectors in the form of micro-bumps 122 on bottom surface 121 is placed over interposer 130 (330). According to flowchart 300, interposer 130 is then utilized to selectively couple at least one of micro-bumps 112 to at least one of micro-bumps 122 (340). For example, in some implementations, interposer 130 may include a B-stage polymeric interposer dielectric 132 having conductive nano-wires or conductive nanotubes dispersed therein. As described above, the conductive nano-wires or nanotubes may be substantially uniformly distributed in interposer dielectric 132, and have their primary axes (e.g., length axis of nano-wire or nanotube) oriented substantially parallel to the plane of interposer 130. An external field, such as an external electromagnetic field, for example, may be applied to interposer dielectric 132 to selectively reorient some of the conductive nano-wires or nanotubes dispersed therein so as to selectively form through-interposer connections 134a and 134b capable of coupling respective micro-bumps 112a and 112b on top surface 111 of first active die 110 to respective micro-bumps 122a and 122b on bottom surface 121 of second active die 120. Interposer dielectric 132 may then undergo a cure process, such as a UV cure or other radiation cure, for example, to more permanently establish through-interposer connections 134a and 134b within interposer 130.

Referring to through-interposer connections 134a and 134b, in FIG. 1, and through-interposer connections 234a, 234b, 254c, and 254d, in FIG. 2, it is noted that the power capacity, e.g., current carrying capacity, as well as the location of those through-interposer connections within their respective interposer dielectrics, may be selectively determined. For instance, through-interposer connections 134a and 234a, which may be implemented to provide high power connections, for example, are shown to be substantially broader than through-interposer connections 134b, 234b, and 254c, which may be configured to mediate low power chip-to-chip signaling. Moreover, according to the implementations shown by FIGS. 1 and 2, through-interposer connection 254d may be implemented to support intermediate power communications between second active die 220 and third active die 240.

Referring again to FIGS. 1 and 3 in combination, flowchart 300 concludes by enclosing first active die 110, second active die 120, and interposer 130 with socket 160, socket 160 being electrically coupled to at least one first active die 110, second active die 120, and interposer 130 (350). In the implementation of FIG. 1, socket 160 is electrically coupled to interposer 130 by socket contacts 162. Alternatively, according to the implementation shown by FIG. 2, socket 260 is electrically coupled to first active die 210 and second active die 220, as well as to third active die 240, by socket contacts 262.

Thus, as set forth above, in one implementation, socket 160/260 may be configured to advantageously shield first active die 110/210, second active die 120/220, and interposer 130/230, as well as third active die 240 and second interposer 250 from electromagnetic interference. In addition, in some implementations socket 160/260 can be configured to provide a common package ground for system-in-package 100/200. Moreover, in some implementations, socket 160/260 may be configured to advantageously provide a heat sink enabling enhanced thermal dissipation for first active die 110/210, second active die 120/220, and interposer 130/230, as well as for third active die 240 and second interposer 250. In yet other implementations, socket 160/260 may be configured to provide enhanced environmental protection, such as moisture protection, for system-in-package 100/200.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A system-in-package comprising:
a first active die having a first plurality of disjoint electrical connectors on a top surface of said first active die;
an interposer situated over said first active die;
a second active die having a second plurality of disjoint electrical connectors on a bottom surface of said second active die;
said interposer selectively couple at least one of said first plurality of disjoint electrical connectors to at least one of said second plurality of disjoint electrical connectors;
an electrically conductive heat sink enclosure enclosing said first and second active dies and said interposer, said electrically conductive heat sink enclosure being electrically coupled to said first active die, said second active die, and said interposer; and
an electrically conductive socket contact between, and in physical contact with, the electrically conductive heat sink enclosure and a first side wall of at least one of the first active die, the second active die, or the interposer.

2. The system-in-package of claim 1, wherein said interposer comprises at least one selectively conductive polymer film that comprises a polymer matrix having nano-wires or nanotubes dispersed therein.

3. The system-in-package of claim 1, wherein said electrically conductive heat sink enclosure is configured to:
shield said first active die, said second active die, and said interposer from electromagnetic interference;
provide a common package ground for the first active die, the second active die, and the interposer; and
provide a heat sink for the first active die, the second active die, and the interposer.

4. A system-in-package comprising:
a first active die having a first plurality of electrical connectors on a top surface of said first active die;
an interposer situated over said first active die;
a second active die having a second plurality of electrical connectors on a bottom surface of said second active die;
said interposer selectively couple at least one of said first plurality of electrical connectors to at least one of said second plurality of electrical connectors;
an electrically conductive heat sink enclosure enclosing said first and second active dies and said interposer, said electrically conductive heat sink enclosure being electrically coupled to said first active die, said second active die, and said interposer; and
an electrically conductive socket contact between, and in physical contact with, the electrically conductive heat sink enclosure and a first side wall of at least one of the first active die, the second active die, or the interposer.

5. The system-in-package of claim 4, wherein said interposer comprises a selectively conductive polymer film.

6. The system-in-package of claim 4, wherein said electrically conductive heat sink enclosure is configured to shield said first active die, said second active die, and said interposer.

7. The system-in-package of claim 4, wherein said electrically conductive heat sink enclosure is configured to provide a common package ground for said first active die, said second active die, and said interposer.

8. The system-in-package of claim 4, wherein said electrically conductive heat sink enclosure is configured to provide a heat sink for said first active die, said second active die, and said interposer.

9. The system-in-package of claim 4, wherein said interposer comprises a selectively conductive polymer film that comprises a polymer matrix having nano-wires or nanotubes dispersed therein.

10. The system-in-package of claim 4, wherein said interposer comprises a selectively conductive polymer film that comprises a polymer matrix having conductive bodies dispersed therein.

11. The system-in-package of claim 4, wherein said interposer comprises a selectively conductive polymer film that comprises an anisotropic conductive film (ACF).

12. The system-in-package of claim 4, further comprising another socket contact between the electrically conductive heat sink enclosure and a second side wall of the at least one of the first active die, the second active die, or the interposer, the second side wall being opposite the first side wall.

13. The system-in-package of claim 4, wherein:
the electrically conductive socket contact is in physical contact with the first side wall of one of the first active die, the second active die, or the interposer, and
the electrically conductive socket contact is nonadjacent to the first side wall of remaining two of the first active die, the second active die, and the interposer.

14. The system-in-package of claim 4, wherein the electrically conductive socket contact is in physical contact with less than an entirety of the first side wall of the at least one of the first active die, the second active die, or the interposer.

15. The system-in-package of claim 4, further comprising an adhesion layer in physical contact with the electrically conductive heat sink enclosure, wherein the electrically conductive socket contact is nonadjacent to the adhesion layer.

16. The system-in-package of claim 4, wherein:
the interposer comprises a first through-interposer connection and a second through-interposer connection, and
the first through-interposer connection is wider than the second through-interposer connection.

17. A method for producing a system-in-package, said method comprising:
providing a first active die having a first plurality of electrical connectors on a top surface of said first active die;
placing an interposer over said first active die;
placing a second active die over said interposer, said second active die having a second plurality of electrical connectors on a bottom surface of said second active die;
utilizing said interposer to selectively couple, via conductive bodies in the interposer, at least one of said first plurality of electrical connectors to at least one of said second plurality of electrical connectors, wherein the conductive bodies have been oriented by a field; and
enclosing in an electrically conductive heat sink enclosure said first and second active dies and said interposer, said electrically conductive heat sink enclosure being electrically coupled to said first active die, said second active die, and said interposer.

18. The method of claim 17, wherein said interposer comprises at least one selectively conductive polymer film that comprises a polymer matrix having nano-wires or nanotubes dispersed therein.

19. The method of claim 17, wherein said electrically conductive heat sink enclosure is configured to:
shield said first active die, said second active die, and said interposer from electromagnetic interference;
provide a common package ground for the first active die, the second active die, and the interposer; and
provide a heat sink for the first active die, the second active die, and the interposer.

20. The method of claim 17, further comprising applying an electromagnetic field to the interposer to selectively orient the field-oriented conductive bodies to selectively form at least one connection in the interposer that couples the at least one of the first plurality of electrical connectors to the at least one of the second plurality of electrical connectors.

* * * * *